(12) United States Patent
Lee et al.

(10) Patent No.: US 6,908,771 B2
(45) Date of Patent: *Jun. 21, 2005

(54) METHOD FOR FABRICATING DC SQUID USING HIGH-TC SUPERCONDUCTING INTRINSIC JOSEPHSON JUNCTIONS

(75) Inventors: Hu-Jong Lee, Kyungsangbuk-do (KR); Young-Wook Son, Kyungsanbuk-do (KR); Jong-Hoon Bae, Kyungsangbuk-do (KR); Myung-Ho Bae, Kyungsangbuk-do (KR)

(73) Assignee: Postech Foundation, Kyungsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/434,224

(22) Filed: May 9, 2003

(65) Prior Publication Data

US 2005/0106313 A1 May 19, 2005

(30) Foreign Application Priority Data

Feb. 13, 2003 (KR) .................................... 10-2003-09015

(51) Int. Cl.[7] .......................... H01L 21/00; H01L 33/00
(52) U.S. Cl. ............................................. 438/2; 505/338
(58) Field of Search ............................. 438/2; 505/330, 505/125, 162, 190, 210, 413, 411, 329, 325, 725, 728, 927; 216/3

(56) References Cited

U.S. PATENT DOCUMENTS

| 5,439,875 A | * | 8/1995 | Tanaka et al. ............... 505/329 |
| 6,605,225 B1 | * | 8/2003 | Yamashita et al. ............. 216/3 |
| 2004/0149983 A1 | * | 8/2004 | Lee et al. ...................... 257/31 |

* cited by examiner

Primary Examiner—W. David Coleman
(74) Attorney, Agent, or Firm—McGuireWoods LLP

(57) ABSTRACT

A DC superconducting interference device (SQUID) utilizes intrinsic Josephson tunnel junctions formed naturally in stacks of high-Tc superconducting single crystals, where the double-side cleaving technique is used to define a ring-shaped high-Tc superconducting structure with two stacks of intrinsic Josephson junctions inserted in the ring.

9 Claims, 5 Drawing Sheets

METHOD FOR FABRICATING DC SQUID USING HIGH-TC SUPERCONDUCTING INTRINSIC JOSEPHSON JUNCTIONS

FIELD OF THE INVENTION

The present invention is related to a method for fabricating a superconducting quantum interference device (SQUID); and, more particularly, to a method for fabricating a direct-current (dc) SQUID using high-Tc superconducting intrinsic Josephson junctions.

BACKGROUND OF THE INVENTION

A dc SQUID consists of a superconducting ring structure with two Josephson junctions inserted therein. The device enables one to detect a minute change in the magnetic flux in an ultra-high sensitivity. With a sensitivity of being several orders of magnitude higher than conventional magneto-resistance devices or Hall magnetometers dc SQUID is commonly used as a magnetometer and a magnetic field gradiometer with an extremely high sensitivity. Furthermore, if the detector element is adaptively modified, dc SQUID can also be utilized as an extremely sensitive detector unit for an electrical voltage, a current, and a resistance. Consequently it is widely employed for applications in the fields of medical diagnosis, military detection, exploration of underground natural resources, basic research and so on.

Ever since the discovery of the high-Tc superconductors in 1986 many attempts have been made to develop dc SQUID devices using high-Tc superconducting materials. Unfortunately fabricating an artificial tunnel junction, the essential element of a SQUID device, using high-Tc superconducting materials has ever been an enormously difficult task. The difficulty stems from the extremely delicate material properties of high-Tc superconductors; the surface degrades easily and loses the superconductivity over the depth of a few nm from the surface once the surface is exposed. This material properties combined with the extremely short superconducting coherence length of high-Tc superconductors make it very difficult to artificially fabricate high-Tc Josephson tunnel junctions.

Accordingly, Josephson weak links, in which grain-boundary junctions such as step-edge junctions, bi-crystal junctions, and bi-epitaxial junctions are employed, have been alternately used as high-Tc superconducting Josephson junction units for varied applications. However, since such grain-boundary junctions are not true tunnel junctions, ideal Josephson tunneling characteristics cannot be obtained. Such grain-boundary junctions are also vulnerable to thermal recycling so that junction characteristics of the weak links are easily deteriorated. These unfavorable material properties pose most serious obstacles in applying high-Tc superconductors to SQUID devices or any active devices consisting of Josephson junctions.

SUMMARY OF THE INVENTION

It is, therefore, a primary object of the present invention to provide a method for fabricating a dc SQUID by using high-Tc superconducting intrinsic Josephson junctions, thereby to obtain SQUID operating conditions that are not deteriorated under the thermal recycling.

In accordance with a preferred embodiment of the invention, there is provided a method for fabricating a dc high-Tc superconducting quantum interference device, the method comprising the steps of:

(a) adhering a high-Tc superconducting single crystal layer on a first insulating substrate by using a first adhesion layer;

(b) cutting away the single crystal layer to form a platform with a first thickness and cutting away a first portion of the platform to generate a platform layer, wherein the portion of the platform layer has a second thickness which is close to ½ of the first thickness;

(c) adhering the platform layer on a second insulating substrate by using a second adhesion layer to form a stacking structure sequentially having the first insulating substrate, the first adhesion layer, the platform layer, the second adhesion layer and the second insulating substrate;

(d) detaching the first insulating substrate from the stacking structure to expose the platform layer and forming a metal layer on the platform layer;

(e) cutting away respective portions from both the metal layer and the platform layer to form an intrinsic Josephson layer having an intrinsic Josephson junction therein;

(f) patterning the platform layer to form a ring-shaped platform layer so that the intrinsic Josephson junction layer in the platform layer is divided into two intrinsic Josephson junction portions in the ring-shaped platform layer; and (g) attaching at least two current electrodes for applying a current into the ring-shaped platform layer and attaching at least two voltage electrodes for detecting a voltage difference across said two stacks of intrinsic Josephson junctions.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The present invention is related to a method for fabricating a dc superconducting quantum interference device (SQUID). Specifically, a double-side-cleaving technique is applied to a layered structure of Josephson junctions intrinsically formed in a high-Tc superconducting single crystal to obtain a platform structure. Then, a micro-patterning process such as photolithography or electron-beam lithography and ion-beam etching are applied to obtain a high-Tc superconducting ring-shaped structure with Josephson junctions inserted therein.

Within the high-Tc superconducting single crystal used in the present invention, Josephson junctions are intrinsically formed between CuO2 superconducting layers along with the formation of the single crystal. In contrast to the grain-boundary junctions described above, the intrinsically formed Josephson junctions have an atomically perfect single crystal structure, with ideally nonlinear current to voltage characteristics pertinent to tunnel junctions, and are very stable against thermal recycling. Accordingly, such intrinsic junctions may be adaptively fabricated to obtain a dc SQUID in accordance with the present invention.

Specifically, a high-Tc superconducting single crystal is processed with the double-sidecleaving process to form a platform layer. The platform layer is processed with the micropatterning and the ion-beam etching to form a high-Tc superconducting ring-shaped layer. Since two Josephson junctions are allowed to be situated in the ring-shaped layer, a high-Tc superconducting dc SQUID can be obtained.

Figure 1:
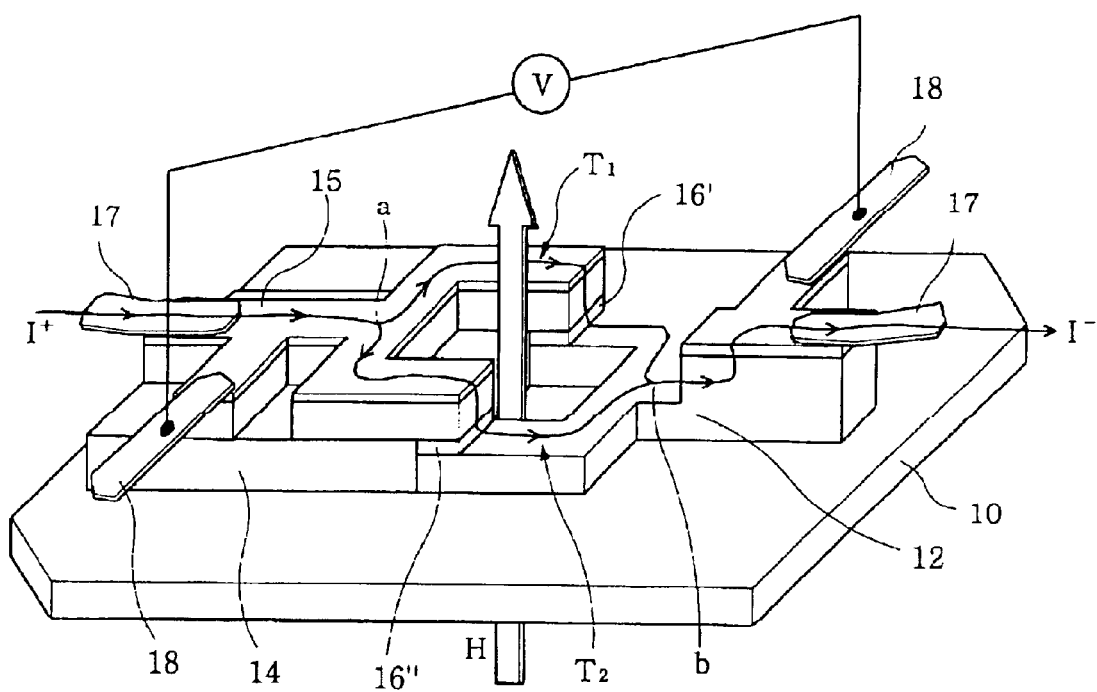
FIG. 1 represents an operation principle of a dc SQUID by using the high-Tc superconducting intrinsic Josephson junctions in accordance with the present invention.

Referring to FIG. 1, there is shown a structure of a dc SQUID device formed with a highTc superconductor in accordance with the present invention. The operation principle will be described hereinafter.

An external magnetic field (H) to be detected is applied perpendicular to the substrate surface of the SQUID device as shown in FIG. 1. While the magnetic field (H) is applied, a current is injected from an I+ electrode to an I− electrode. At the point (a), the current is divided into two paths T1 and T2, respectively. Two currents tunnel through two Josephson junctions, respectively, and then merge at the point (b). Superconducting electron pairs along two paths T1 and T2 undergo different phase changes in a magnetic field in accordance with the quantum mechanical principle so that, at the point (b), the relative phase change of superconducting electron pairs results in an electron interference phenomenon. Accordingly, the electron detection probability changes with an external magnetic field. The total bias current is set to be larger than the sum of two critical currents in two Josephson junctions so that the SQUID may be operated under a finite-voltage mode.

Accordingly, a voltage difference (V) occurs between two voltage electrodes located outside the ring by the electron interferences in an external magnetic field with a period of flux quantum in accordance with the magnetic flux threading the superconducting ring-shaped structure, so that a minute magnetic field may be detected. Since the magnetic flux threading the superconducting ring is equal to the external magnetic field multiplied by the area of the superconducting ring and the flux quantum is so small ($2 \times 10^{-7}$ gauss·cm2) that a minute change of the external magnetic field can be detected from the periodic voltage change between two voltage electrodes.

Referring to FIGS. 2A to 2G, there is shown a manufacturing process of a superconducting quantum interference device (SQUID) in accordance with the present invention. Firstly, a thin layer of negative photoresist or polyimide in its liquid state is spin-coated at an angular speed in a range of about 1000 and about 2000 rpm on an insulating substrate 20 made of glass, sapphire or magnesium oxide. After a high-Tc superconducting single crystal such as Bi2Sr2Ca2O8+x (Bi-2212) is attached on the layer, the insulating substrate with the high-Tc superconducting signal crystal thereon is heated at temperatures in a range of about 80° C. to about 120° C. for about 30 minutes to about 60 minutes so that the photoresist layer is hardened to firmly fix the high-Tc superconducting single crystal on the substrate. Accordingly, it is assumed that the photoresist layer is inserted between the first substrate, i.e., the insulating substrate 20, and the platform base 23 of a high-Tc superconducting signal crystal in FIGS. 2A and 2B. Then, an adhesive force of a piece of scotch tape is used to perform a double-side cleaving of the signal crystal. Specifically, a piece of adhesive scotch tape is repeatedly attached to and detached from the single crystal so that a freshly cleaved surface of the single crystal is prepared. Since the Bi-2212 single crystal has a high anisotropy, it is easily cleaved by using a piece of adhesive scotch tape.

Figure 2A:
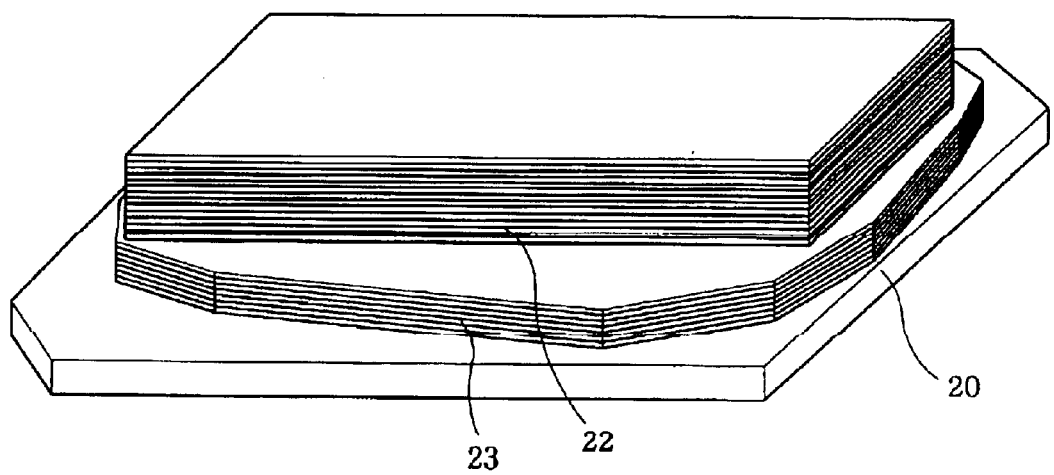
FIGS. 2A to 2G provide a fabrication process of the dc SQUID by using the high-Tc superconducting intrinsic Josephson junctions in accordance with the present invention.

As shown in FIG. 2A, a micro-patterning by using photolithography or electron lithography and/or ion-beam etching are used to form a platform 22 on the surface of the Bi-2212 single crystal, wherein the platform 22 has an area of about a few tens of $\mu m2$ to about a few hundreds of $\mu m2$ and a first thickness of about 30 nm to about 200 nm. After the ion etching is completed, the polymer layer, e.g., a positive photoresist used for photo-lithography or a PMMA material used for electron lithography, is removed by immersing the substrate into a solvent such as acetone or by performing an oxygen plasma ashing process. The ion etching process as described includes a process for removing the polymer layer used for the lithography.

Figure 2B:
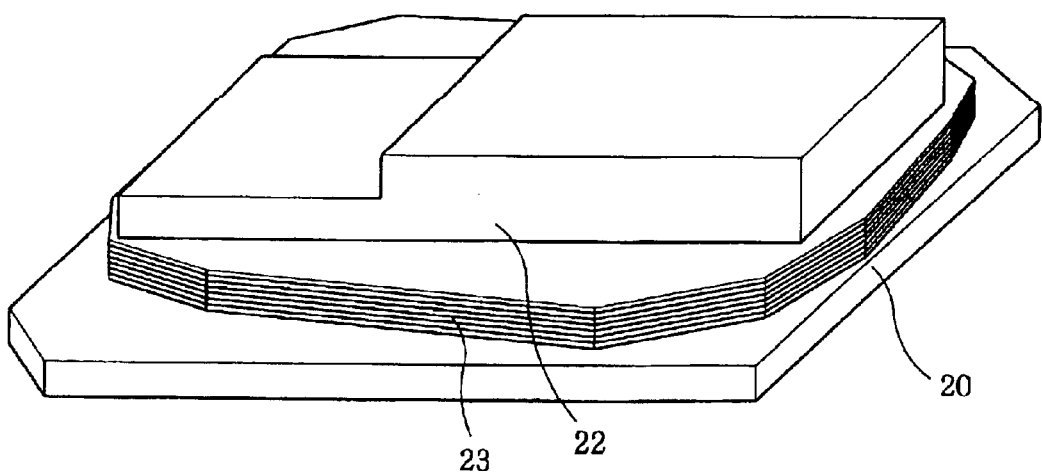
Figure 2C:
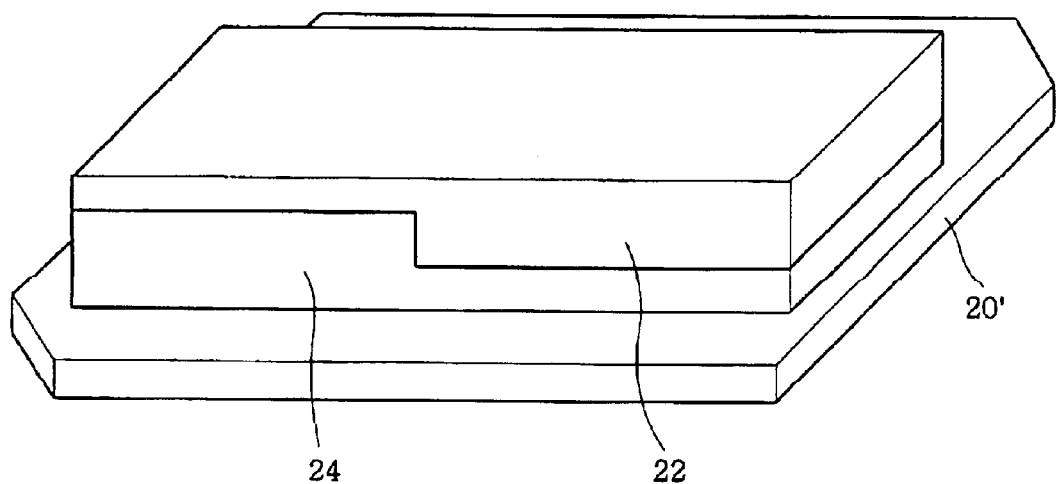

Referring to FIG. 2B, the micro-patterning and the ion-beam etching are used to perform an secondary etching process for a second portion of the Bi-2212 platform so that the second portion of the Bi-2212 platform has a second thickness smaller than a half of the first thickness. It is preferable that the second thickness is several nm smaller than a half of the first thickness. Then, a double-side cleaving technique is used to define the opposite surface of the single crystal as shown in FIG. 2C. In other words, the negative photoresist or polyimide is coated on a second substrate 20' by using the same method as used in FIG. 2A so that an adhesion layer 24 may be formed and then the platform structure shown in FIG. 2B, wherein the second substrate 20' is made of the same material as the first substrate 20.

The first and the second substrates 20 and 20' with the single crystal 22 therebetween are heated in an oven by using the same method as described in FIG. 2A so that the adhesion layer 24 made of negative photoresist or polyimide may be hardened. Then the first and the second substrates are detached from each other by exerting a force, so that the first substrate 20 and the platform base 23 attached thereon are removed. Accordingly, the platform 22 obtained through the process as in FIG. 2B may be attached on the second substrate 20' with the upper surface inverted. Therefore, it is assumed that the adhesion layer is inserted between the second substrate 20' and the superconducting platform 22 in FIGS. 2C to 2G. The adhesion layer 24 shown in FIGS. 2C to 2G is formed through the process described above. In the process, the double-side cleaving may be used to entirely remove the platform base 23.

Figure 2D:
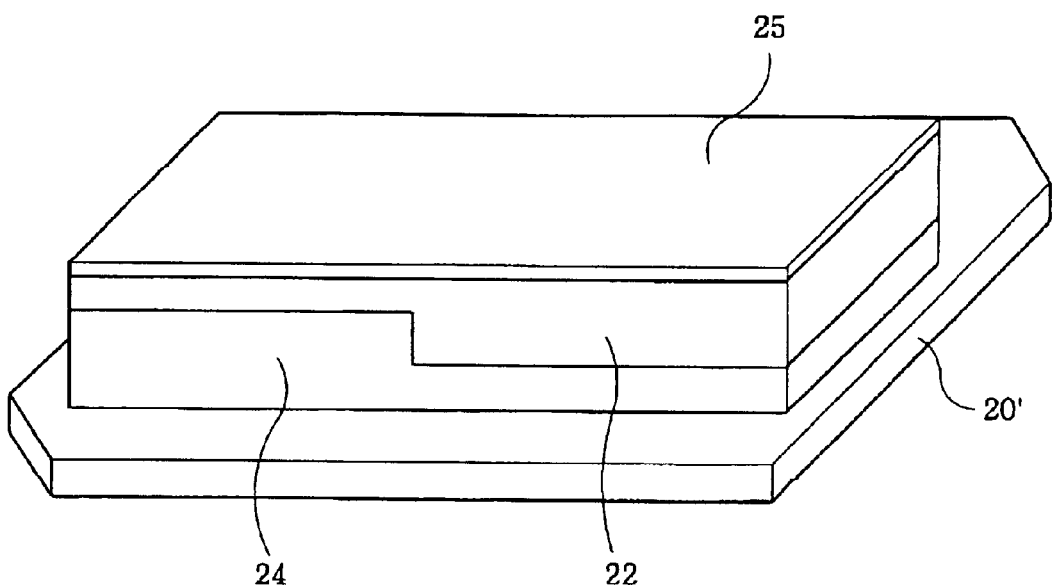

Then, as shown in FIG. 2D, a metal layer 25 is deposited with the depth ranging from about 100 nm to 300 nm on the single crystal platform 22 attached on the second substrate 20'. The metal layer 25 may be micro-patterned and ion-etched to fit the size of the platform 22. The metal layer 25 may be deposited and patterned by using a conventional micro-fabrication method. It is preferable that the metal layer is made of rare-earth metals such as Au, Pt and the like. The rare-earth metal layer keeps the oxygen doping condition of the high-Tc superconducting layer, i.e., the $CuO2$ layer, of the platform unchanged.

Figure 2E:
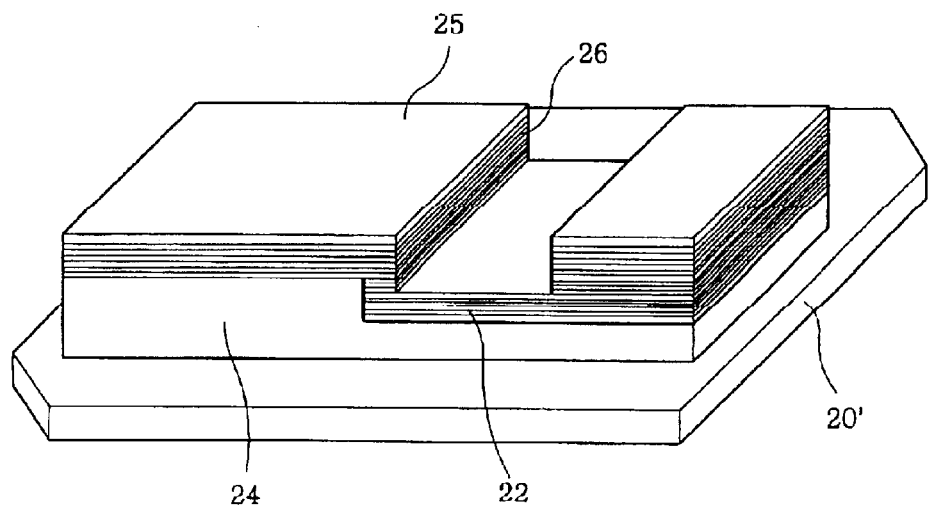

Referring to FIG. 2E, the metal layer 25 attached on the platform 22 is micro-patterned by using the positive photoresist and then ion-etched so that respective portions from both the metal layer 25 and the platform 22 may be removed. It is preferable that a removed portion of the Bi-2212 single crystal in the platform 22 is several nm deeper than a half of the first thickness of the platform 22 so that a stepped portion between two removed portions may include only several intrinsic Josephson junctions 26. The width of the stepped portion is preferably to be about 2 $\mu m$ to about 10 $\mu m$. It is preferable that the stepped potion contains as few intrinsic Josephson junctions as possible.

Figure 2F:
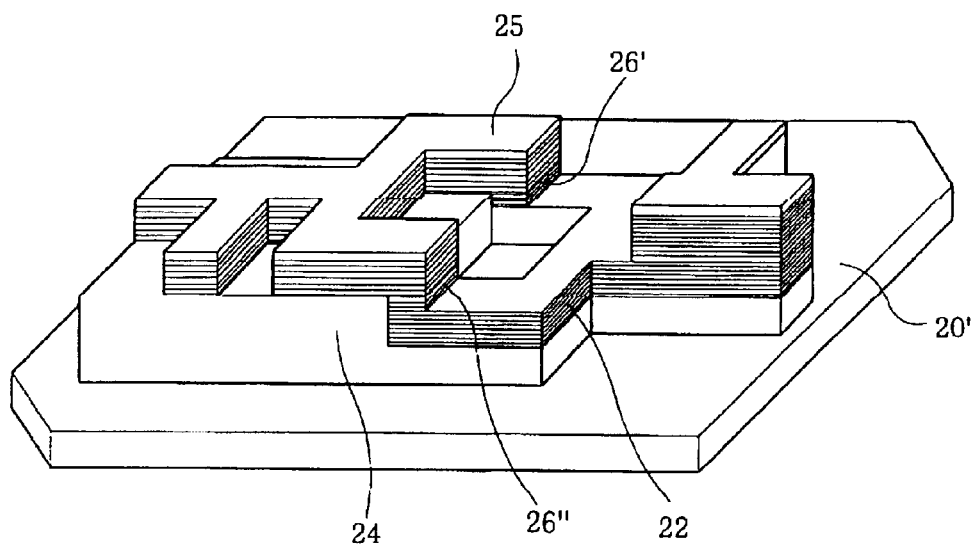

The micro-patterning and the ion etching are further used to fabricate the platform shape shown in FIG. 2E so that a ring-shaped Bi-2212 platform 22 may be fabricated, wherein two stacks of Josephson junctions 26' and 26" are contained as shown in FIG. 2F.

Figure 2G:
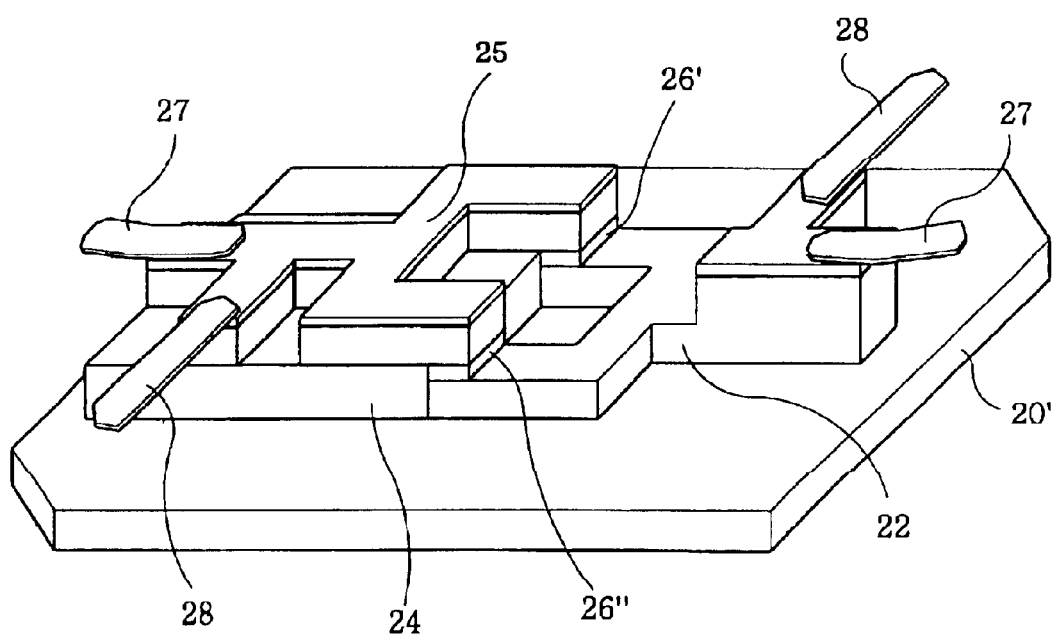

As described above, a ring-shaped SQUID structure may be obtained, wherein two stacks of intrinsic Josephson junctions 26' and 26" may act as the Josephson-junction elements in the ring-shaped SQUID structure. In order to put extension electrodes for operating the SQUID, the micro-patterning with the positive photoresist is used to define current electrodes 27 and voltage electrodes 28 as shown in FIG. 2G. After a metal layer with the thickness ranging from about 100 nm to about 300 nm is deposited, a lift-off process is performed to form the electrodes.

Since the Josephson junctions located within the ring-shaped superconductor are intrinsic Josephson junctions that are naturally formed during the growing of the single crystal, they have no atomic defects and, therefore, the characteristics of the intrinsic Josephson junctions do not degrade while the Josephson junctions are processed to be located within the ring-shaped superconductor in accordance with the present invention. Accordingly, the Josephson junctions are very stable against repeated thermal recycling processes in accordance with the present invention. Moreover, since the junctions are located deep inside the stack of intrinsic Josephson junctions from the surface, the junction characteristics are not affected by the surface degradation. Accordingly, the technical problems for fabricating Josephson junctions using high-Tc superconductors may be solved in accordance with the present invention and, therefore, diverse active devices based on Josephson junctions can be developed in accordance with the present invention.

The Bi-2212 high-Tc superconducting single crystals may be replaced by other kinds of high-Tc superconducting single crystals, such as Tl2Ba2Ca2Cu3O10+x (Tl-2223), which is another typical material with a large material anisotropy.

In the present method for fabricating a dc SQUID by using high-Tc superconducting intrinsic Josephson junctions one can avoid the technical difficulty of fabricating the artificial high-Tc superconducting Josephson junctions in accordance with the present invention. The characteristic of Josephson junctions intrinsically formed in high-Tc single crystals may be used to define the ring-shaped structure of high-Tc superconducting layer using the double-sidecleaving process. Further, since intrinsic Josephson junctions may be included in the ring-shaped structure, a high-Tc SQUID may be formed. Accordingly, the double-side-cleaving process and the Josephson-junction insertion process should be performed precisely in accordance with the present invention. Since the present SQUID with two Josephson junctions inserted therein may be used as a high-sensitive magnetometer, voltmeter, ammeter, ohmmeter and magnetic field gradiometer, it can be utilized for a medical application to detect brain and heart waves, a military application for detecting submarines and a scientific application for detecting underground natural resources, and weak magnetic and electrical signal. Although a high-Tc superconducting dc SQUID has been commercially used since 1970s, it is operable only at very low temperatures around 4 K. Since, however, high-Tc SQUIDs can be operated at temperatures in the range of 10 or 20 times higher than that of the low-Tc SQUID, the detection temperature range can be highly extended. Since, further, liquid nitrogen may be used as refrigerant, the operation cost for SQUID devices can be significantly reduced.

While the invention has been shown and described with respect to the preferred embodiments, it will be understood by those skilled in the art that various changes and modifications may be made without departing from the spirit and scope of the invention as defined in the following claims.

What is claimed is:

1. A method for fabricating a dc superconducting quantum interference device, the method comprising the steps of:

(a) adhering a high-Tc superconducting single crystal layer on a first insulating substrate by using a first adhesion layer;

(b) cutting away the single crystal layer to form a platform with a first thickness and cutting away a first portion of the platform to generate a platform layer, wherein the portion of the platform layer has a second thickness which is close to ½ of the first thickness;

(c) adhering the platform layer on a second insulating substrate by using a second adhesion layer to form a stacking structure sequentially having the first insulating substrate, the first adhesion layer, the platform layer, the second adhesion layer and the second insulating substrate;

(d) detaching the first insulating substrate from the stacking structure to expose the platform layer and forming a metal layer on the platform layer;

(e) cutting away respective portions from both the metal layer and the platform layer to form an intrinsic Josephson junction layer having intrinsic Josephson junctions therein;

(f) patterning the platform layer to form a ring-shaped platform layer so that the intrinsic Josephson junction layer in the platform layer is divided into two intrinsic Josephson junction portions in the ring-shaped platform layer; and (g) attaching at least two current electrodes for applying a current into the circular platform layer and attaching at least two voltage electrodes for detecting a voltage difference across said two stacks of intrinsic Josephson junctions.

2. The method of claim 1, wherein the high-Tc superconducting single crystal layer is a Bi-2212 or a Tl-2223 high-Tc superconducting single crystal.

3. The method of claim 1, wherein the first and the second insulating substrates are made of one or more elements selected from a group of glass, sapphire and magnesium oxide.

4. The method of claim 1, wherein the first thickness ranges from about 30 nm to about 200 nm.

5. The method of claim 1, wherein said steps (b), (e) and (f) are performed by a micro-patterning technique and an ion etching technique.

6. The method of claim 1, wherein the second adhesion layer is formed with a negative photoresist or a polyimide.

7. The method of claim 1, wherein the metal layer has a thickness of about 100 nm to about 300 nm.

8. The method of claim 1, wherein the intrinsic Josephson junction layer has a width of about 2 micrometer to about 10 micrometer.

9. The method of claim 1, wherein said steps (b) and (d) are performed by a double-side-cleaving technique.

* * * * *